(12) United States Patent
Derderian et al.

(10) Patent No.: US 7,402,498 B2
(45) Date of Patent: Jul. 22, 2008

(54) METHODS OF FORMING TRENCH ISOLATION REGIONS

(75) Inventors: Garo J. Derderian, Boise, ID (US); H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 280 days.

(21) Appl. No.: 11/208,965

(22) Filed: Aug. 22, 2005

(65) Prior Publication Data
US 2006/0003543 A1 Jan. 5, 2006

Related U.S. Application Data

(62) Division of application No. 10/817,029, filed on Apr. 1, 2004, now Pat. No. 7,015,113.

(51) Int. Cl.
*H01L 21/76* (2006.01)
(52) U.S. Cl. .................. 438/426; 438/424; 438/435; 438/E21.546; 438/E21.549
(58) Field of Classification Search ......... 438/424–431, 438/435–439
See application file for complete search history.

(56) References Cited

U.S. PATENT DOCUMENTS

| | | | |
|---|---|---|---|
| 4,675,265 A | 6/1987 | Kazama et al. | |
| 5,362,668 A | 11/1994 | Tasaka | |
| 5,393,694 A | 2/1995 | Mathews | |
| 5,736,296 A | 4/1998 | Sato et al. | |
| 6,069,055 A * | 5/2000 | Ukeda et al. | 438/424 |
| 6,140,208 A * | 10/2000 | Agahi et al. | 438/437 |
| 6,261,922 B1 | 7/2001 | Walker et al. | |
| 6,323,104 B1 | 11/2001 | Trivedi | |
| 6,340,624 B1 | 1/2002 | Doan et al. | |
| 6,355,966 B1 | 3/2002 | Trivedi | |
| 6,391,738 B2 | 5/2002 | Moore | |

(Continued)

FOREIGN PATENT DOCUMENTS

EP 5176627 9/1992

(Continued)

OTHER PUBLICATIONS

D. F. Franceschini et al., *Internal stress reduction by nitrogen incorporation in hard amorphous carbon thin films*, Appl. Phys. Lett., vol. 60, No. 29, pp. 3229-3231 (Jun. 29, 1992).

*Primary Examiner*—Dung A. Le
(74) *Attorney, Agent, or Firm*—Wells St. John P.S.

(57) ABSTRACT

The invention includes methods of forming trench isolation regions. In one implementation, a masking material is formed over a semiconductor substrate. The masking material comprises at least one of tungsten, titanium nitride and amorphous carbon. An opening is formed through the masking material and into the semiconductor substrate effective to form an isolation trench within semiconductive material of the semiconductor substrate. A trench isolation material is formed within the isolation trench and over the masking material outside of the trench effective to overfill the isolation trench. The trench isolation material is polished at least to an outermost surface of the at least one of tungsten, titanium nitride and amorphous carbon of the masking material. The at least one of tungsten, titanium nitride and amorphous carbon is/are etched from the substrate. Other implementations and aspects are contemplated.

12 Claims, 8 Drawing Sheets

U.S. PATENT DOCUMENTS

| | | |
|---|---|---|
| 6,413,828 B1 | 7/2002 | Lam |
| 6,576,530 B1 | 6/2003 | Chen et al. |
| 6,583,028 B2 | 6/2003 | Doan et al. |
| 6,593,206 B2 | 7/2003 | Dickerson et al. |
| 6,653,202 B1 | 11/2003 | Fisher et al. |
| 6,750,117 B1 | 6/2004 | Hung et al. |
| 6,750,127 B1 | 6/2004 | Chang et al. |
| 6,774,007 B2 | 8/2004 | Liu et al. |
| 6,939,794 B2 | 9/2005 | Yin et al. |
| 2002/0173163 A1 | 11/2002 | Gutsche |
| 2006/0006502 A1* | 1/2006 | Yin et al. .................... 257/635 |

FOREIGN PATENT DOCUMENTS

| | | |
|---|---|---|
| WO | PCT/US2005/010197 | 9/2005 |
| WO | PCT/US2005/010197 | 10/2005 |
| WO | PCT/US2005/010197 | 7/2006 |

* cited by examiner

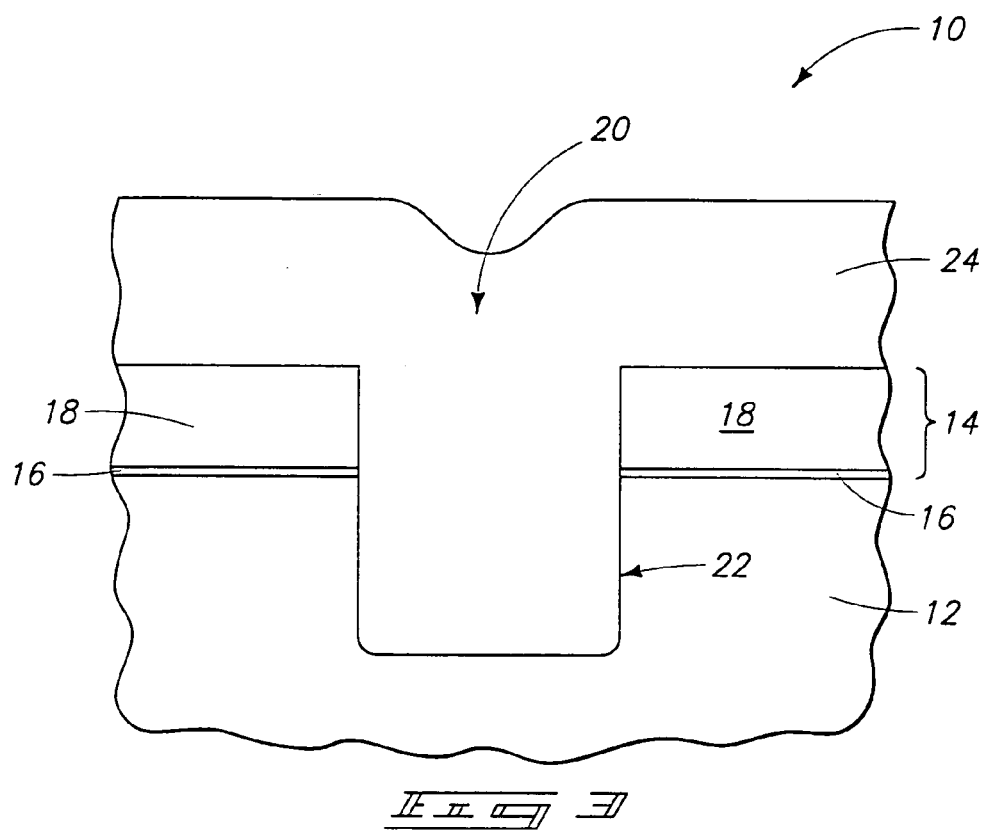
_Fig 3_
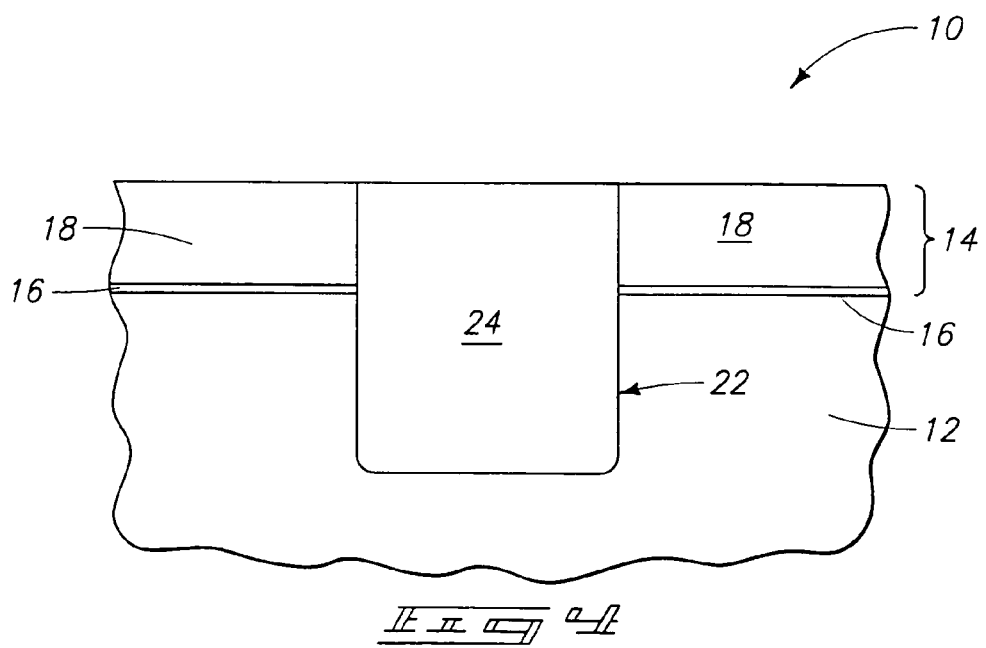
_Fig 4_

METHODS OF FORMING TRENCH ISOLATION REGIONS

RELATED PATENT DATA

This patent resulted from a divisional application of U.S. patent application Ser. No. 10/817,029, now U.S. Pat. No. 7,015,113, filed Apr. 1, 2004, entitled "Methods of Forming Trench Isolation Regions", naming Garo J. Derderian and H. Montgomery Manning as inventors, the disclosure of which is incorporated by reference.

TECHNICAL FIELD

This invention relates to methods of forming trench isolation regions.

BACKGROUND OF THE INVENTION

In typical semiconductor device applications, numerous devices are packed into a small area of a semiconductor substrate to create an integrated circuit. Many of the individual devices are electrically isolated from one another. Accordingly, electrical isolation is an integral part of semiconductor device design for preventing unwanted electrical coupling between adjacent components and devices.

Conventional methods of isolating circuit components typically use trench isolation regions. Such are formed by depositing or otherwise forming a masking layer over a semiconductor substrate. Trenches are etched through the masking layer into the semiconductor substrate, with the trenches being subsequently filled with insulative material. Exemplary masking materials for trench isolation include silicon nitride and polysilicon with or without an underlying pad oxide layer. Further after forming the trenches, they are typically lined with silicon nitride which ultimately forms part of the trench isolation material. Sidewalls of the trenches are typically oxidized as well to form silicon dioxide and either before or after the nitride liner deposition.

The trench isolation material which is formed in the isolation trenches typically includes deposition of insulative material over the masking material and to within the trenches, typically over-filling them. The isolation material is typically then polished back, for example by chemical-mechanical polishing, at least to the outer surface of the masking material. The masking material is then typically selectively etched away from the substrate leaving, at least at this point in the process, insulative isolation material filling and extending outwardly of the trench isolation regions. Unfortunately where the masking material comprises silicon nitride and where silicon nitride is also utilized to line the trenches, the nitride liner might get etched as well. This can cause nitride liner recessing within the trenches relative to the outer surface of the semiconductive material of the substrate. This can result in gate oxide wrap-around that can degrade the transistors which are ultimately fabricated.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming trench isolation regions. In one implementation, a masking material is formed over a semiconductor substrate. The masking material comprises at least one of tungsten, titanium nitride and amorphous carbon. An opening is formed through the masking material and into the semiconductor substrate effective to form an isolation trench within semiconductive material of the semiconductor substrate. A trench isolation material is formed within the isolation trench and over the masking material outside of the trench effective to overfill the isolation trench. The trench isolation material is polished at least to an outermost surface of the at least one of tungsten, titanium nitride and amorphous carbon of the masking material. The at least one of tungsten, titanium nitride and amorphous carbon is/are etched from the substrate.

In one implementation, a method of forming a trench isolation region comprises forming masking material over a semiconductor substrate, where at least some of the masking material is oxidizable. An opening is formed through the masking material and into the semiconductor substrate effective to form an isolation trench within semiconductive material of the semiconductor substrate. The opening and the isolation trench have respective sidewalls. The substrate is exposed to oxidizing conditions effective to oxidize the masking material sidewalls at a greater rate than which the sidewalls of the semiconductive material are oxidized. Trench isolation material is formed within the isolation trench.

In one implementation, a method of forming a trench isolation region comprises forming a masking material over a semiconductor substrate. An opening is formed through the masking material and into the semiconductor substrate effective to form an isolation trench within semiconductive material of the semiconductor substrate. A silicon nitride comprising layer is deposited within the isolation trench and over the masking material effective to line the trench. Trench isolation material is deposited over the silicon nitride comprising layer within the isolation trench and over the masking material outside of the trench. The trench isolation material and the silicon nitride comprising layer are polished at least to the masking material. The masking material and the trench isolation material are removed relative to the silicon nitride comprising layer from outwardly of semiconductive material of the semiconductor substrate effective to leave a portion of the silicon nitride comprising layer projecting outwardly from semiconductive material of the semiconductor substrate.

Other implementations and aspects are contemplated.

BRIEF DESCRIPTION OF THE DRAWINGS

Preferred embodiments of the invention are described below with reference to the following accompanying drawings.

FIG. 3 is a view of the FIG. 2 wafer fragment at a processing subsequent to that depicted by FIG. 2.

FIG. 4 is a view of the FIG. 3 wafer fragment at a processing subsequent to that depicted by FIG. 3.

DETAILED DESCRIPTION OF THE PREFERRED EMBODIMENTS

This disclosure of the invention is submitted in furtherance of the constitutional purposes of the U.S. patent Laws "to promote the progress of science and useful arts" (Article 1, Section 8).

Figure 1:
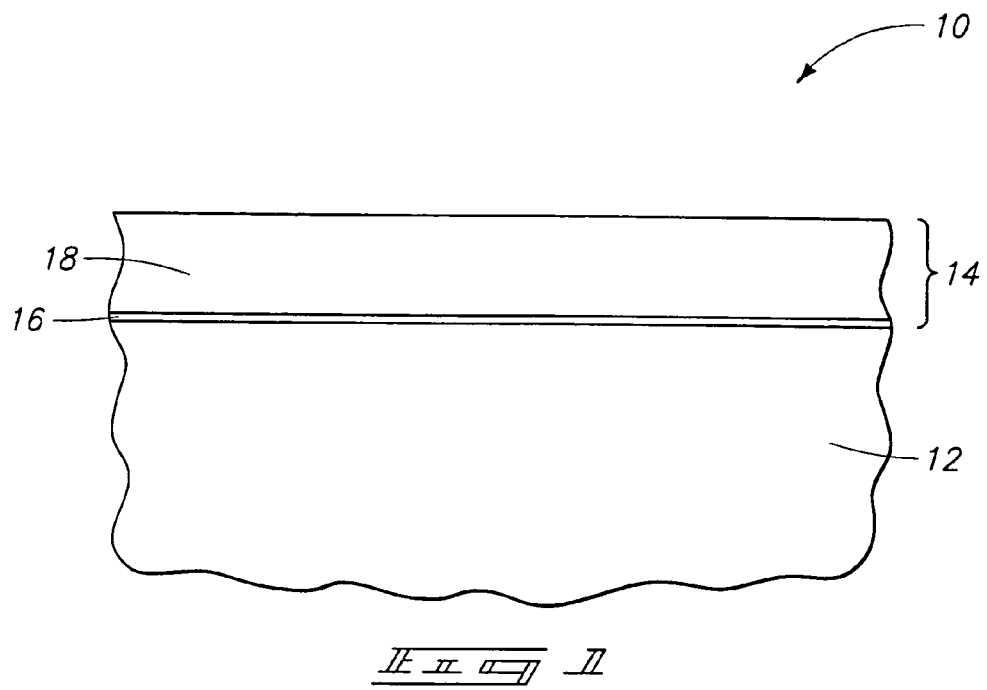
FIG. 1 is a diagrammatic section view of a semiconductor wafer fragment in process in accordance with an aspect of the invention.

An exemplary embodiment method of forming a trench isolation region is initially described with reference to FIGS. 1-5. FIG. 1 depicts a semiconductor substrate 10 comprising bulk semiconductive material 12, for example monocrystalline silicon. Although the invention is described throughout in the preferred context of bulk semiconductor processing, semiconductor-on-insulator fabrication methods as well as any other methods of fabricating trench isolation regions are contemplated in accordance with the invention. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural.

A masking material 14 is formed over and comprises semiconductor substrate 10. In the depicted exemplary embodiment, such comprises a pad oxide layer 16 and a layer 18 formed thereover. An exemplary thickness for layer 16 is from 20 Angstroms to 75 Angstroms, with 60 Angstroms being a preferred specific example. Masking material layer 18 preferably has a thickness of from 200 Angstroms to 1,500 Angstroms, with 500 Angstroms being a specific preferred example. Masking material layer 18 comprises at least one of tungsten (in elemental and/or alloy form), titanium nitride and amorphous carbon. In one embodiment where amorphous carbon is utilized, it might comprise at least one of boron and nitrogen.

Further in one exemplary embodiment with respect to amorphous carbon, such might comprise a layer that is transparent to visible light. In the context of this document, an amorphous carbon comprising layer that is transparent to visible light means that the amorphous carbon comprising layer has a substantially low absorption coefficient (k) in which k has a range between about 0.15 and about 0.001 (or lower) at wavelength 633 nm. The amorphous carbon comprising layer transparent to visible light range radiation, by way of example only, might be formed at a temperature from about 200° C. to about 450° C., with an exemplary preferred pressure range being from about 3 Torr to about 7 Torr. A specific preferred example is 375° C. and 5 Torr. Such deposition preferably occurs by plasma generation, with an exemplary power applied to the showerhead being from 500 watts to 1100 watts, with 800 watts being a specific preferred example. An exemplary flow rate for the $C_3H_6$ is from 400 sccm to 2400 sccm, with 1450 sccm being a specific preferred example. An exemplary preferred flow rate for the helium is from 250 sccm to 650 sccm, with 450 sccm being a specific preferred example. An exemplary preferred spacing of the showerhead/substrate support-susceptor is 240 mils. Exemplary additional or other hydrocarbon gases utilizable in producing transparency as described include $CH_4$, $C_2H_2$, $C_2H_4$, $C_2H_6$, and $C_3H_8$. A preferred gas provided during such deposition might be either one gas or a combination of various gases, including the absence of any helium. Further, lower temperature depositions can result in greater transparency than higher temperature depositions. By way of example only, an exemplary deposition thickness over the substrate for the amorphous carbon comprising layer is 4000 Angstroms. If boron and/or nitrogen doping of the amorphous carbon comprising layer is desired, an exemplary boron source gas is $B_2H_6$ at an exemplary flow rate of 1500 sccm, and an exemplary nitrogen source gas is $N_2$ at an exemplary flow rate of 1000 sccm. Where boron doping is desired, an exemplary concentration range in the layer for boron is from 0.5% atomic to 60% atomic. Where nitrogen doping is desired, an exemplary concentration range in the layer for nitrogen is from 0.1% atomic to 20% atomic.

Hard masking and/or antireflective coating layers might be utilized over masking material layer 18. In one preferred embodiment, masking material 14 is void of silicon nitride.

Figure 2:
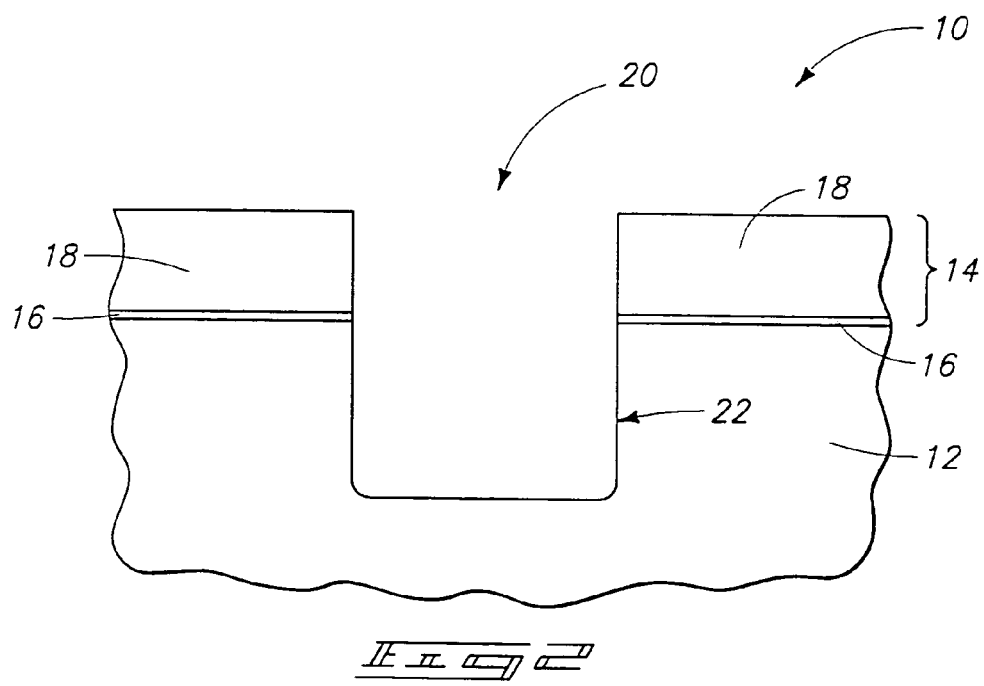
FIG. 2 is a view of the FIG. 1 wafer fragment at a processing subsequent to that depicted by FIG. 1.

Referring to FIG. 2, an opening 20 has been formed through masking material 14 into semiconductor substrate 10 effective to form an isolation trench 22 within semiconductive material 12 of semiconductor substrate 10. An exemplary preferred manner of doing so is by photolithographic patterning, development and etching, whether using existing or yet-to-be developed technologies.

Referring to FIG. 3, trench isolation material 24 has been formed within isolation trench 22 and over masking material 14 outside of trench 22 effective to overfill isolation trench 22. An exemplary preferred material is silicon dioxide, for example high density plasma deposited silicon dioxide, and further, for example, with or without thermal oxide and/or silicon nitride trench liner materials.

Referring to FIG. 4, trench isolation material 24 has been polished at least to an outermost surface of the at least one of tungsten, tungsten nitride and amorphous carbon material 18 of masking material 14. Exemplary preferred techniques include chemical-mechanical polishing, for example utilizing any existing or yet-to-be developed CMP tool and slurries.

Figure 5:
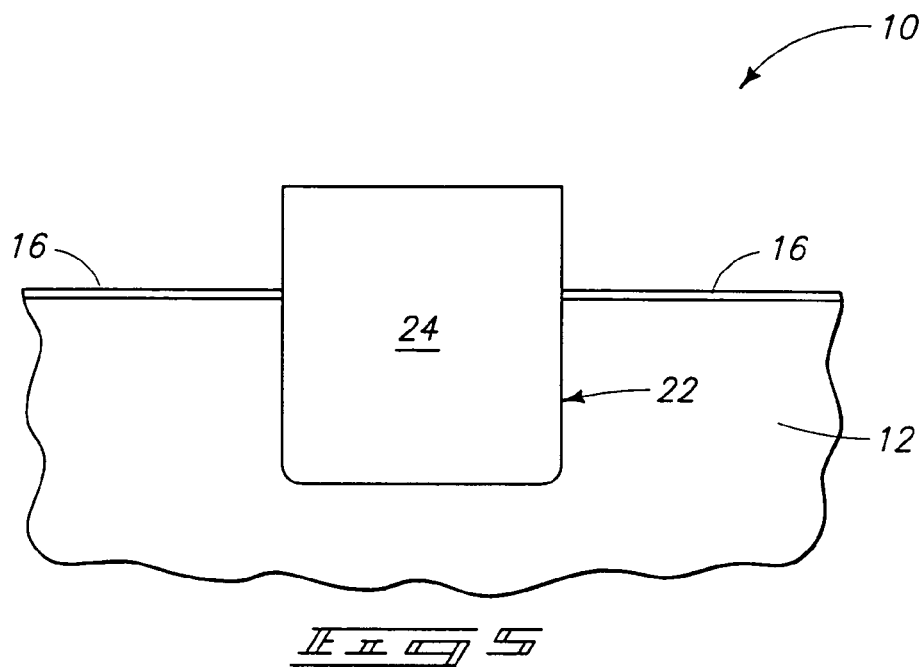
FIG. 5 is a view of the FIG. 4 wafer fragment at a processing subsequent to that depicted by FIG. 4.

Referring to FIG. 5, the at least one of tungsten, titanium nitride and amorphous carbon material 18 has been etched from the substrate. Preferably, the etching is conducted selectively to at least some of trench isolation material 24, with the etching as shown being selective to all of trench isolation material 24. In the context of this document, a selective etch or removal removes one material compared to another at a ratio of at least 2:1. The exemplary pad oxide layer 16 might also be removed, as well as some or all of material 24 from outwardly of isolation trench 22.

Figure 6:
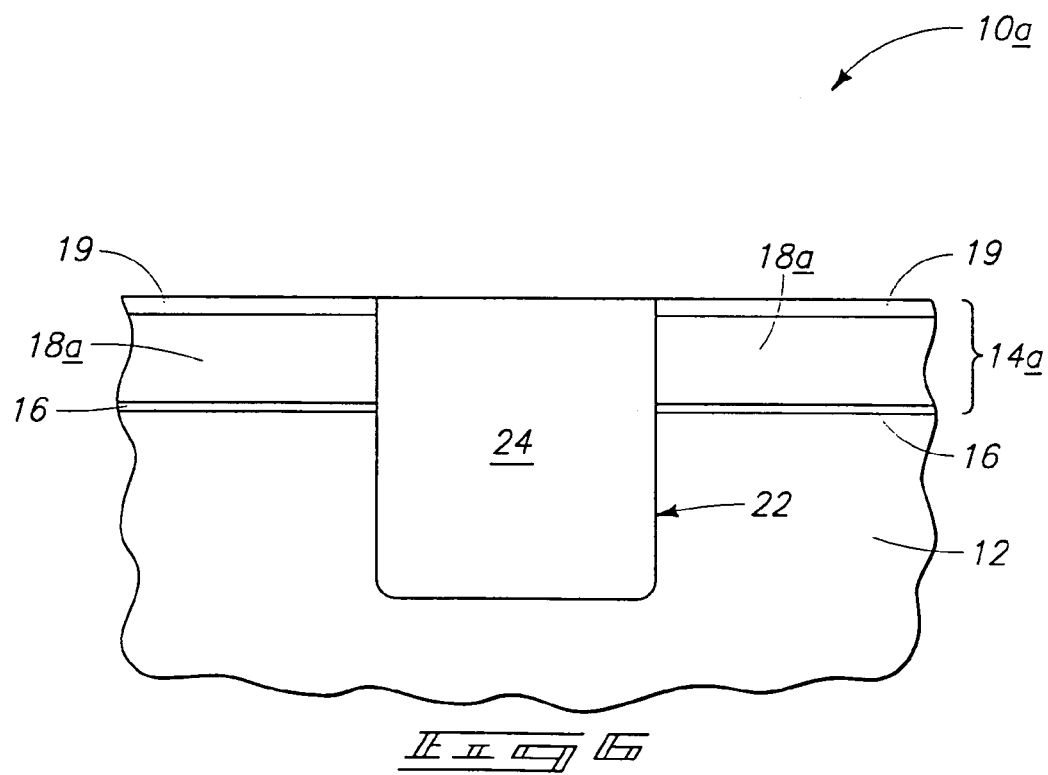
FIG. 6 is a diagrammatic section view of another semiconductor wafer fragment in process in accordance with an aspect of the invention.

By way of example only, an alternate exemplary embodiment to that depicted by FIG. 4 is illustrated in FIG. 6 in connection with a semiconductor substrate 10a. Like numerals from the first-described embodiment are utilized where appropriate, with differences being indicated with different numerals or with the suffix "a". Masking material 14a comprises at least two of tungsten, titanium nitride and amorphous carbon with, for example, an outer layer 19 of at least one of such materials being received outwardly of masking material layer 18a which comprises another of at least one of tungsten, titanium nitride and amorphous carbon. In one exemplary embodiment, material 19 preferably comprises amorphous carbon and material 18a comprises at least one of tungsten and tungsten nitride.

Figure 7:
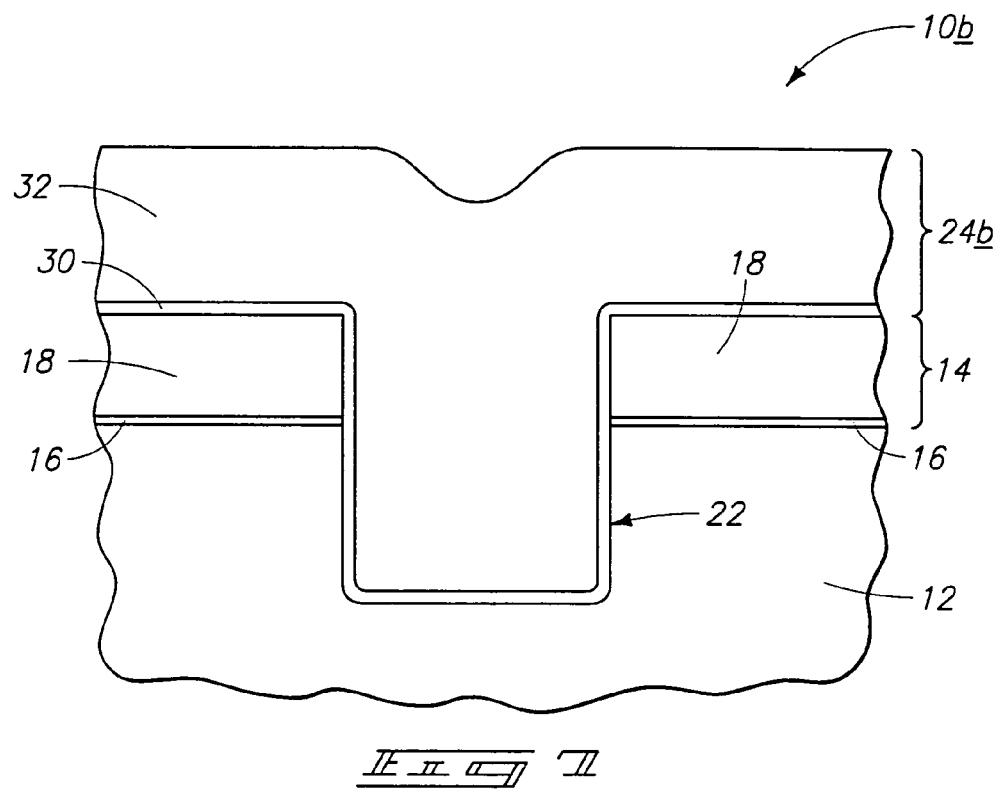
FIG. 7 is a diagrammatic section view of another semiconductor wafer fragment in process in accordance with an aspect of the invention.

By way of example only, another exemplary embodiment method of forming a trench isolation region is described with reference to FIGS. 7-9 in connection with a semiconductor substrate 10b. Like numerals from the first-described embodiment are utilized where appropriate, with differences being indicated with different numerals or with the suffix "b". Referring to FIG. 7, trench isolation material 24b has been formed within isolation trench 22 and over masking material 14 outside of trench 22 effective to overfill isolation trench 22. Trench isolation material 24b includes a silicon nitride comprising layer 30 and at least one material 32 other than silicon nitride formed thereover. An exemplary thickness for layer 30 is 70 Angstroms, and an exemplary preferred material for layer 32 is high density plasma deposited silicon dioxide. Of course, a thermal silicon dioxide layer might be formed on trench sidewalls 22 before or after deposition of layer 30.

Figure 8:
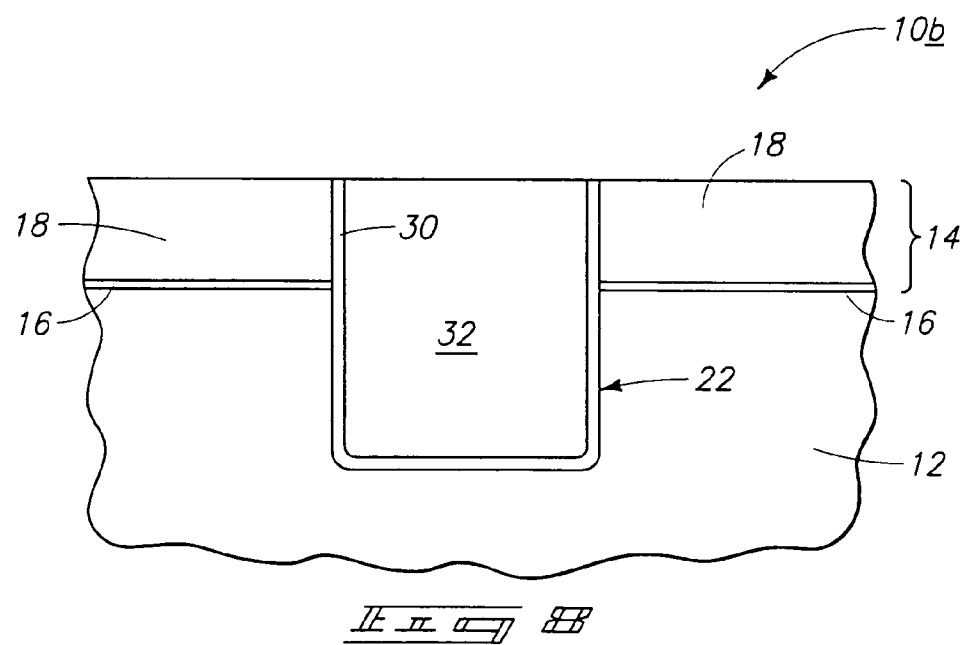
FIG. 8 is a view of the FIG. 7 wafer fragment at a processing subsequent to that depicted by FIG. 7.

Referring to FIG. 8, trench isolation material 24b has been polished to at least an outermost surface of the at least one of tungsten, titanium nitride and amorphous carbon material 18 of masking material 14.

Figure 9:
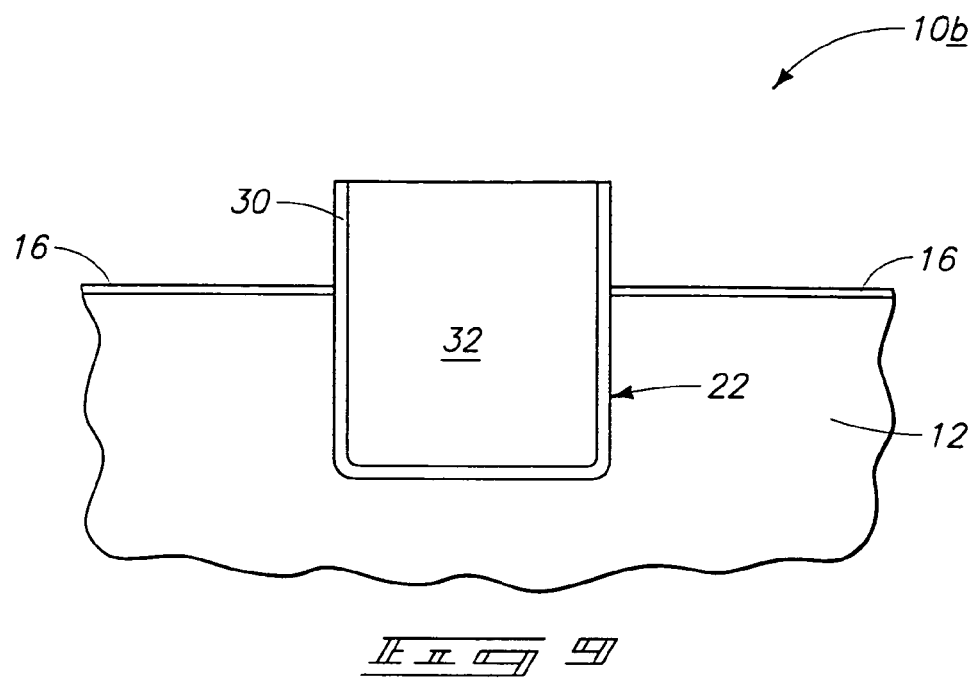
FIG. 9 is a view of the FIG. 8 wafer fragment at a processing subsequent to that depicted by FIG. 8.

Referring to FIG. 9, the at least one of tungsten, titanium nitride and amorphous carbon material 18 has been etched from the substrate substantially selectively to silicon nitride comprising layer 30. By way of example only, an exemplary etching chemistry for etching elemental tungsten, amorphous carbon, and/or TiN selectively relative to silicon nitride comprises $H_2SO_4$ and $H_2O_2$ at a 9:1 ratio by weight at 140° C. Further by way of example only, an exemplary etching chemistry for etching elemental tungsten and/or TiN selectively relative to silicon nitride comprises $H_2O$, $HCl$, and $H_2O_2$ at a 20:4:1 ratio by weight at 70° C.

Figure 10:
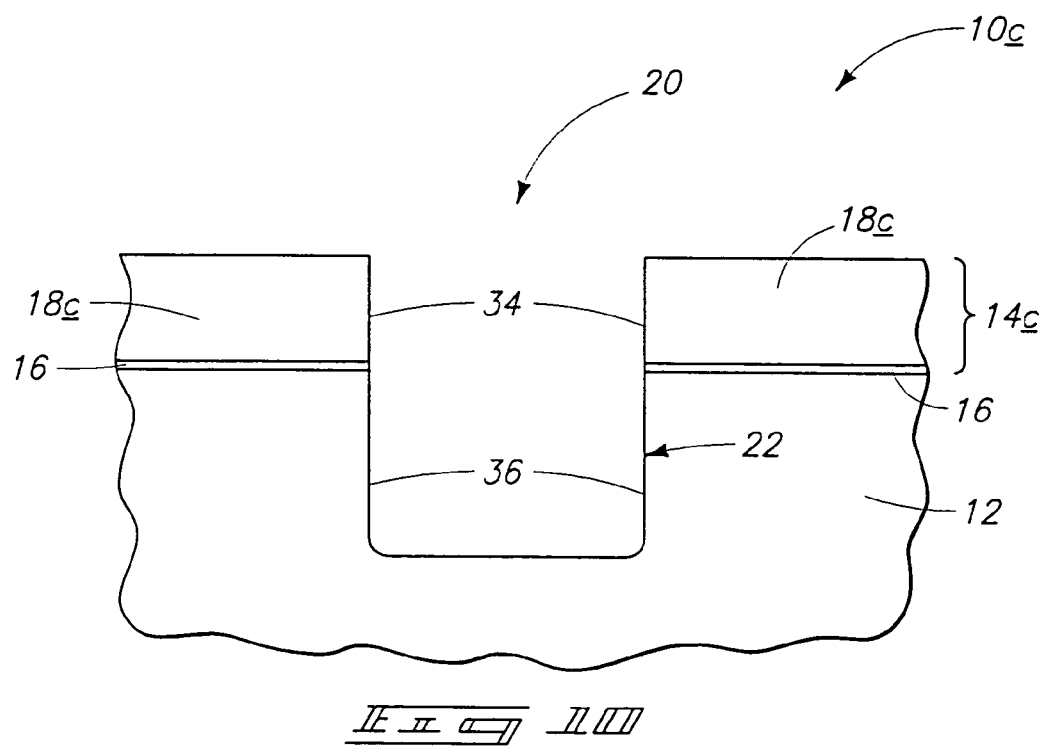
FIG. 10 is a diagrammatic section view of another semiconductor wafer fragment in process in accordance with an aspect of the invention.

Yet another exemplary method of forming a trench isolation region is described in connection with FIGS. 10-13 in connection with a semiconductor substrate 10c. Like numerals from the first-described embodiment are utilized where appropriate, with differences being indicated with different numerals or with the suffix "c". Referring initially to FIG. 10, a masking material 14c has been formed over semiconductor substrate 12. Such is depicted as comprising a pad oxide layer 16 and an overlying material 18c, at least some of which is oxidizable. Thicknesses are preferably as described above in connection with the first described embodiment. Exemplary materials include those as described above, specifically tungsten, amorphous carbon, and/or tungsten nitride. An additional alternate exemplary material is polysilicon, whether updoped or doped with another material or materials such as boron and/or phosphorus. Additional oxidizable masking materials are contemplated, whether existing or yet-to-be developed. Regardless, in one exemplary preferred embodiment, masking material 14c is void of silicon nitride.

Referring to FIG. 10, an opening 20 is formed through masking material 14c and into semiconductor substrate 10c effective to form an isolation trench 22 within semiconductive material 12 of semiconductor substrate 10c. Mask opening 20 has sidewalls 34, and isolation trench 22 has sidewalls 36.

Figure 11:
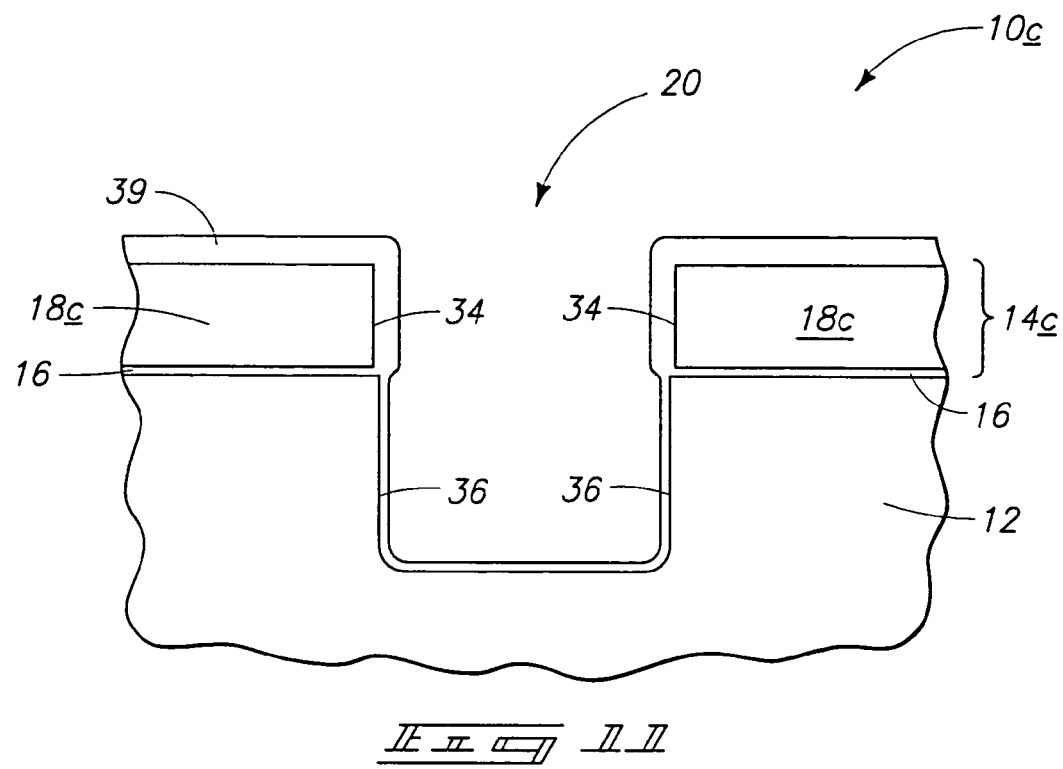
FIG. 11 is a view of the FIG. 10 wafer fragment at a processing subsequent to that depicted by FIG. 10.

Referring to FIG. 11, substrate 10c has been exposed to oxidizing conditions effective to oxidize masking material sidewalls 34 at a greater rate than that at which sidewalls 36 of semiconductor material 12 are oxidized. Thereby in one preferred embodiment, an oxide layer 39 is formed which is laterally thicker over the masking material sidewalls within opening 20 than over the sidewalls of semiconductive material 12.

Figure 12:
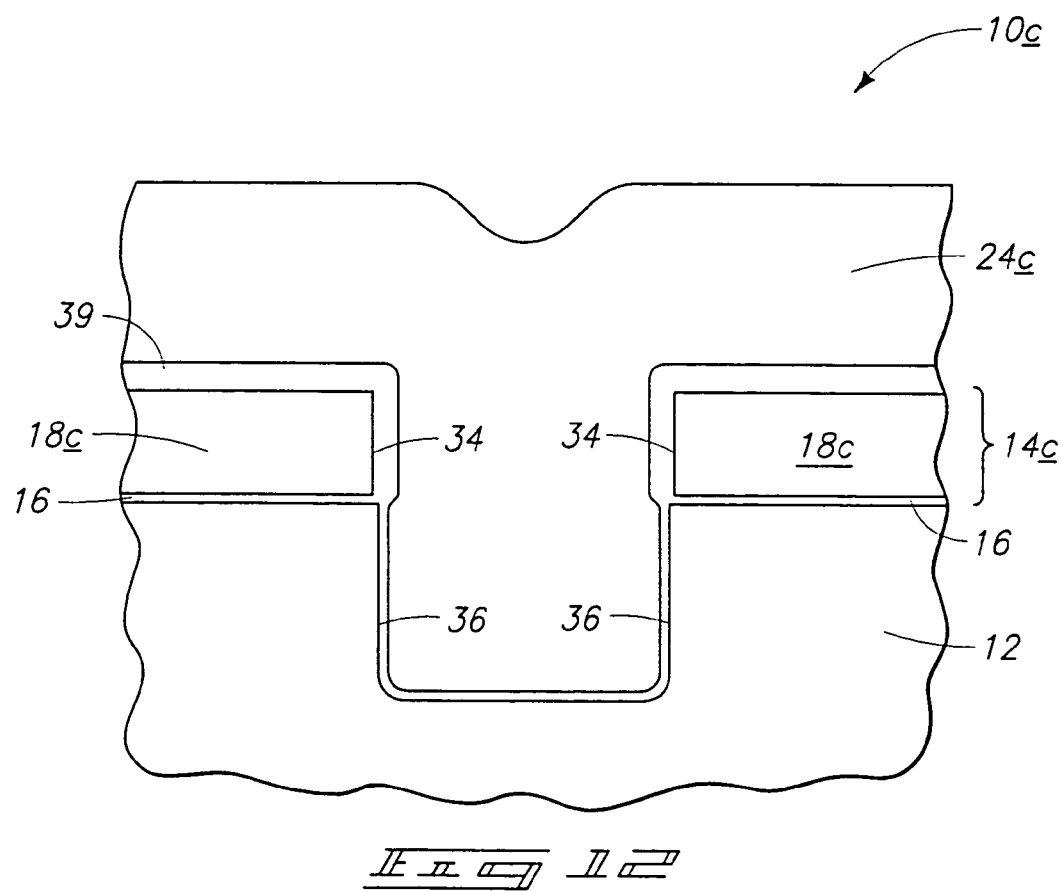
FIG. 12 is a view of the FIG. 11 wafer fragment at a processing subsequent to that depicted by FIG. 11.
Figure 13:
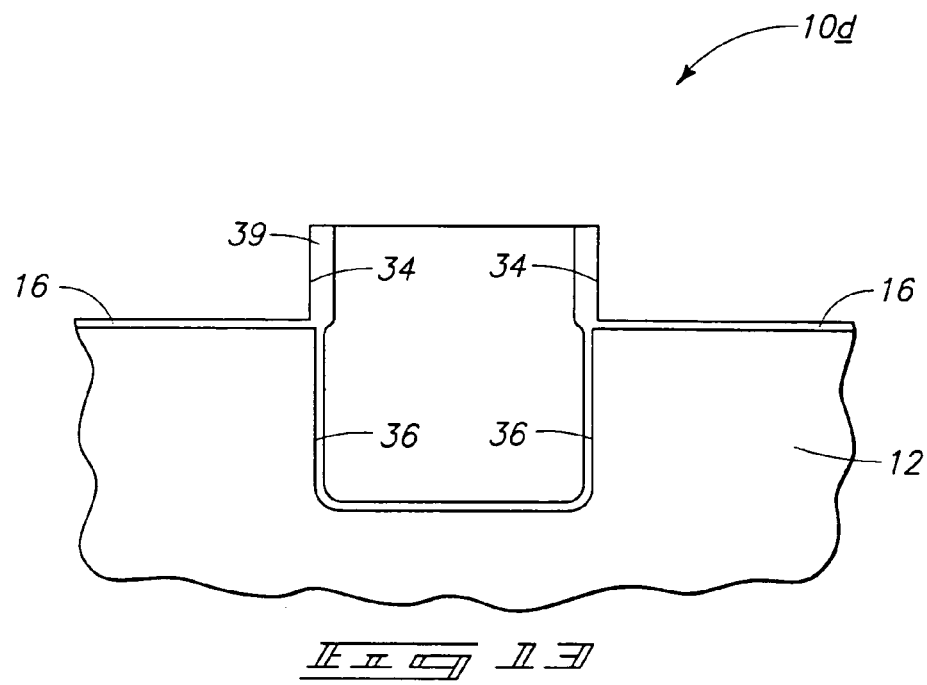
FIG. 13 is a view of the FIG. 12 wafer fragment at a processing subsequent to that depicted by FIG. 12.

Referring to FIG. 12, trench isolation material 24c has been formed within isolation trench 22. Such might comprise one or more materials, with material 39 also comprising trench isolation material. Processing might otherwise continue as described above in connection with the first-described embodiments, for example whereby materials 24c, 39 and 14c are removed outwardly from semiconductive material 12, for example as shown in FIG. 13.

Figure 14:
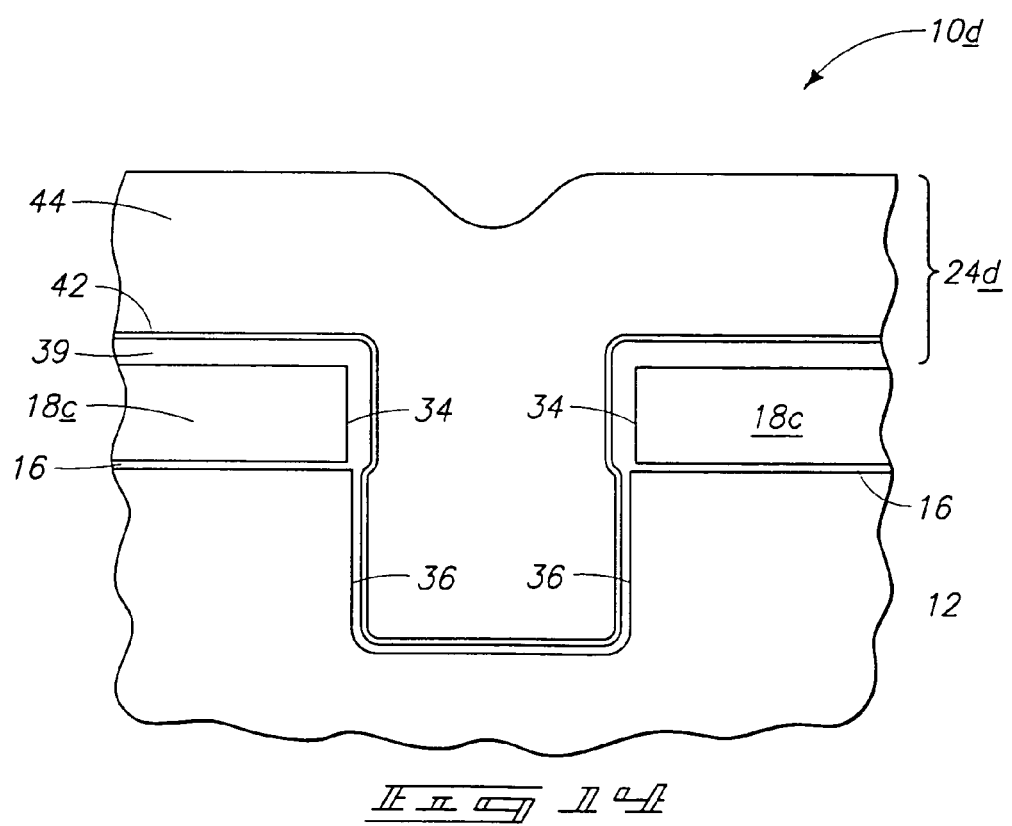
FIG. 14 is a diagrammatic section view of another semiconductor wafer fragment in process in accordance with an aspect of the invention.
Figure 15:
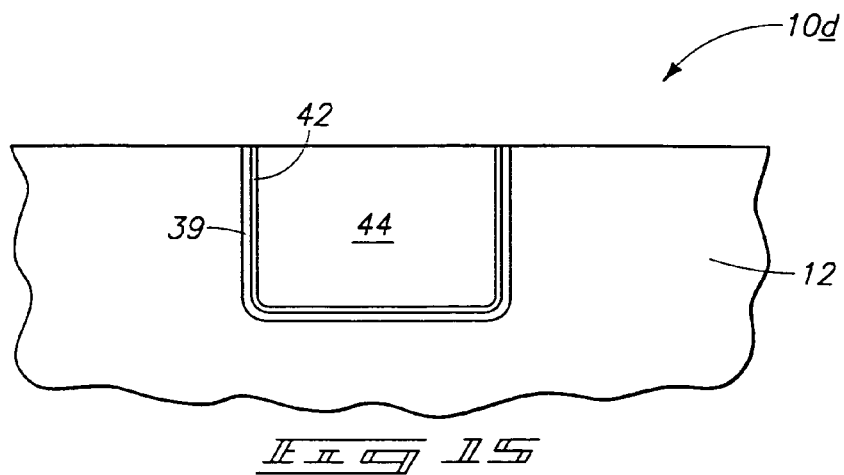
FIG. 15 is a view of the FIG. 14 wafer fragment at a processing subsequent to that depicted by FIG. 14.

An alternate exemplary embodiment semiconductor substrate 10d is depicted in FIGS. 14 and 15. Like numerals from the FIGS. 10-13 embodiment are utilized where appropriate, with differences being indicated with different numerals or with the suffix "d". Referring to FIG. 14, semiconductor substrate 10d is shown as being formed to comprise trench isolation material 24d comprising a silicon nitride comprising layer 42 received over (and "on", as shown) the oxidized masking material sidewalls and oxidized semiconductive material sidewalls (i.e., on material 39). An exemplary additional material 44 is formed thereover, for example high density plasma deposited silicon dioxide.

Referring to FIG. 15, and by way of example only, subsequent processing is depicted whereby all material has been removed outwardly from material 12 of semiconductor substrate 10d.

Figure 16:
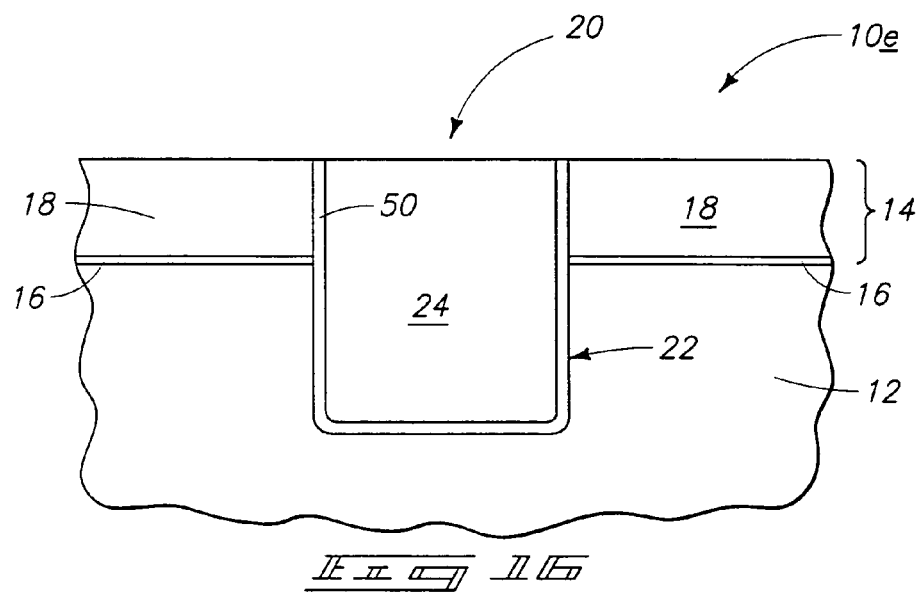
FIG. 16 is a diagrammatic section view of another semiconductor wafer fragment in process in accordance with an aspect of the invention.

Yet another preferred method of forming a trench isolation region in accordance with aspects of the invention is described in connection with a semiconductor substrate 10e in FIGS. 16 and 17. Like numerals from the first-described embodiments are utilized where appropriate, with differences being indicated with different numerals or with the suffix "e". Referring to FIG. 16, a masking material 14 is formed over a semiconductor substrate 12. Any material is contemplated, and including for example those described above, and preferably with such masking material being void of silicon nitride. An opening 20 has been formed through masking material 14 and into semiconductor material 12 effective to form an isolation trench 22 within material 12 of semiconductor substrate 10e. A silicon nitride comprising layer 50 has been deposited within isolation trench 22 and over masking material 14 effective to line trench 22. An exemplary thickness for layer 50 is from 10 Angstroms to 150 Angstroms. Trench isolation material 24 has been deposited over silicon nitride comprising layer 50 within isolation trench 22 and over masking material 14 outside of trench 22. Exemplary preferred materials are as described above, namely high density plasma deposited silicon dioxide. FIG. 16 depicts such trench isolation material 24 and silicon nitride comprising layer 50 as having been polished at least to masking material 14.

Figure 17:
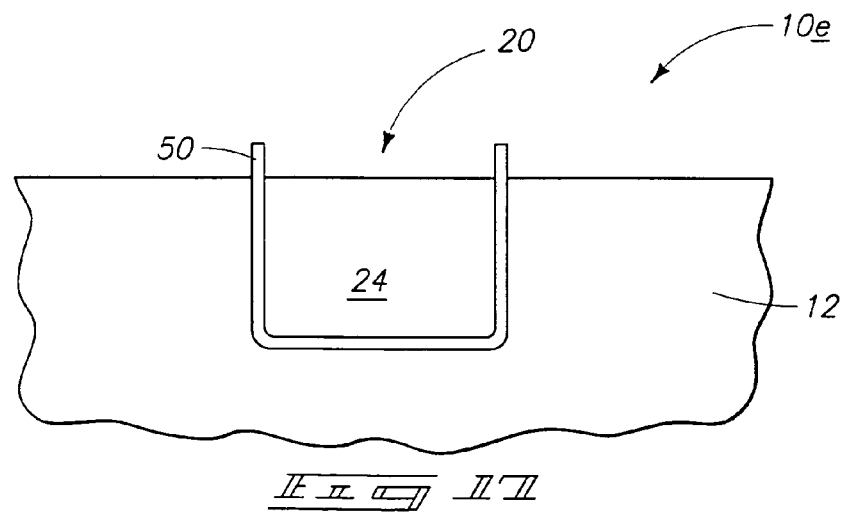
FIG. 17 is a view of the FIG. 16 wafer fragment at a processing subsequent to that depicted by FIG. 16.

Referring to FIG. 17, masking material 14 and trench isolation material 24 have been removed relative to silicon nitride comprising layer 50 from outwardly of semiconductive material 12 of semiconductive substrate 10e effective to leave a portion of silicon nitride comprising layer 50 projecting outwardly of semiconductive material 12 of semiconductive substrate 10e. An exemplary technique for such processing, where for example material 24 is silicon dioxide and material 18 is polysilicon includes dipping or spraying with a 25:1 by volume solution of $H_2O$:HF at room temperature and pressure conditions. Alternately with polysilicon and silicon dioxide, such a solution could be utilized initially to strip any native oxide overlying material 18 followed by etching polysilicon with tetramethyl ammonium hydroxide (TMAH). An exemplary such solution is 2.25% TMAH by weight in deionized water at 30° C.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a trench isolation region comprising:
    forming a masking material over a semiconductor substrate; the masking material comprising at least one of tungsten, titanium nitride and amorphous carbon;
    forming an opening through the masking material and into the semiconductor substrate effective to form an isolation trench within semiconductive material of the semiconductor substrate;
    forming trench isolation material within the isolation trench and over the masking material outside of the trench effective to overfill the isolation trench, the trench isolation material comprising a silicon nitride-comprising layer having at least one material other than silicon nitride formed thereover;
    polishing the trench isolation material at least to an outermost surface of the at least one of tungsten, titanium nitride and amorphous carbon of the masking material; and
    after the polishing, etching the at least one of tungsten, titanium nitride and amorphous carbon from the substrate substantially selectively to the silicon nitride-comprising layer and etching all remaining of the masking material from the substrate.

2. The method of claim 1 wherein the masking material comprises tungsten.

3. A method of forming a trench isolation region comprising:
    forming a masking material over a semiconductor substrate; the masking material comprising titanium nitride;
    forming an opening through the masking material and into the semiconductor substrate effective to form an isolation trench within semiconductive material of the semiconductor substrate;
    forming trench isolation material within the isolation trench and over the masking material outside of the trench effective to overfill the isolation trench, the trench isolation material comprising a silicon nitride-comprising layer having at least one material other than silicon nitride formed thereover;
    polishing the trench isolation material at least to an outermost surface of the titanium nitride of the masking material; and
    etching the titanium nitride of the masking material from the substrate substantially selectively to the silicon nitride-comprising layer.

4. The method of claim 1 wherein the masking material comprises amorphous carbon.

5. A method of forming a trench isolation region comprising:
    forming a masking material over a semiconductor substrate; the masking material comprising amorphous carbon comprising at least one of boron and nitrogen;
    forming an opening through the masking material and into the semiconductor substrate effective to form an isolation trench within semiconductive material of the semiconductor substrate;
    forming trench isolation material within the isolation trench and over the masking material outside of the trench effective to overfill the isolation trench, the trench isolation material comprising a silicon nitride-comprising layer having at least one material other than silicon nitride formed thereover;
    polishing the trench isolation material at least to an outermost surface of the amorphous carbon of the masking material; and
    etching the amorphous carbon of the masking material from the substrate substantially selectively to the silicon nitride-comprising layer.

6. The method of claim 5 wherein the amorphous carbon comprises both boron and nitrogen.

7. A method of forming a trench isolation region comprising:
    forming a masking material over a semiconductor substrate; the masking material comprising amorphous carbon which is transparent to visible light;
    forming an opening through the masking material and into the semiconductor substrate effective to form an isolation trench within semiconductive material of the semiconductor substrate;
    forming trench isolation material within the isolation trench and over the masking material outside of the trench effective to overfill the isolation trench, the trench isolation material comprising a silicon nitride-comprising layer having at least one material other than silicon nitride formed thereover;
    polishing the trench isolation material at least to an outermost surface of the amorphous carbon of the masking material; and
    etching the amorphous carbon of the masking material from the substrate substantially selectively to the silicon nitride-comprising layer.

8. A method of forming a trench isolation region comprising:
    forming a masking material over a semiconductor substrate; the masking material comprising at least two of tungsten, titanium nitride and amorphous carbon;
    forming an opening through the masking material and into the semiconductor substrate effective to form an isolation trench within semiconductive material of the semiconductor substrate;
    forming trench isolation material within the isolation trench and over the masking material outside of the trench effective to overfill the isolation trench, the trench isolation material comprising a silicon nitride-comprising layer having at least one material other than silicon nitride formed thereover;

polishing the trench isolation material at least to an outermost surface of the masking material; and etching said at least two of tungsten, titanium nitride and amorphous carbon of the masking material from the substrate substantially selectively to the silicon nitride-comprising layer.

9. The method of claim 8 wherein the masking material comprises amorphous carbon.

10. The method of claim 1 wherein the etching is conducted selectively to all of the trench isolation material.

11. The method of claim 1 wherein the masking material is void of silicon nitride.

12. The method of claim 1 wherein the masking material comprises titanium nitride.

* * * * *